(12) United States Patent
Audet et al.

(10) Patent No.: US 7,017,128 B2
(45) Date of Patent: Mar. 21, 2006

(54) CONCURRENT ELECTRICAL SIGNAL WIRING OPTIMIZATION FOR AN ELECTRONIC PACKAGE

(75) Inventors: Jean Audet, Granby (CA); Timothy W. Budell, Milton, VT (US); Patrick H. Buffet, Essex Junction, VT (US); Alain Caron, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 10/738,799

(22) Filed: Dec. 17, 2003

(65) Prior Publication Data

US 2004/0132229 A1   Jul. 8, 2004

Related U.S. Application Data

(62) Division of application No. 10/041,347, filed on Jan. 8, 2002, now Pat. No. 6,703,706.

(51) Int. Cl.
   *G06F 17/50*   (2006.01)
(52) U.S. Cl. .................. 716/2; 716/18; 716/4
(58) Field of Classification Search .............. 716/1–18; 327/66
   See application file for complete search history.

(56) References Cited

U.S. PATENT DOCUMENTS

| | | | |
|---|---|---|---|
| 5,237,514 A * | 8/1993 | Curtin ........................ | 716/10 |
| 5,500,804 A * | 3/1996 | Honsinger et al. ............ | 716/16 |
| 5,912,809 A | 6/1999 | Steigerwald et al. | |
| 5,999,714 A * | 12/1999 | Conn et al. .................... | 716/2 |
| 6,005,895 A | 12/1999 | Perino et al. | |
| 6,084,779 A | 7/2000 | Fang | |
| 6,127,025 A | 10/2000 | Bhatt et al. | |
| 6,172,305 B1 | 1/2001 | Tanahashi | |
| 6,218,631 B1 | 4/2001 | Hetzel et al. | |
| 6,405,346 B1 * | 6/2002 | Nawa ............................ | 716/2 |
| 6,538,524 B1 | 3/2003 | Miller | |
| 6,714,462 B1 * | 3/2004 | Pan ....................... | 365/189.05 |
| 6,772,406 B1 * | 8/2004 | Trimberger ................... | 716/12 |
| 6,788,113 B1 * | 9/2004 | Watanabe et al. ............. | 327/66 |
| 6,826,733 B1 * | 11/2004 | Hathaway et al. ............. | 716/2 |
| 2003/0115568 A1 * | 6/2003 | Miller et al. ................... | 716/15 |

* cited by examiner

*Primary Examiner*—Vuthe Siek
*Assistant Examiner*—Binh Tat
(74) *Attorney, Agent, or Firm*—Schmeiser, Olsen & Watts; William H. Steinberg

(57) ABSTRACT

The present invention relates to a method for optimization of a signal wire structure, providing concurrent optimization of a plurality of wire parameters, providing a plurality of wiring solutions, wherein each of said wiring solutions produces a wiring package having different wire parameters, providing an electronic package, determining the optimal wiring solutions for said electronic package; and producing an electronic package, using the optimized wiring package solutions. The resulting apparatus is also disclosed.

9 Claims, 5 Drawing Sheets

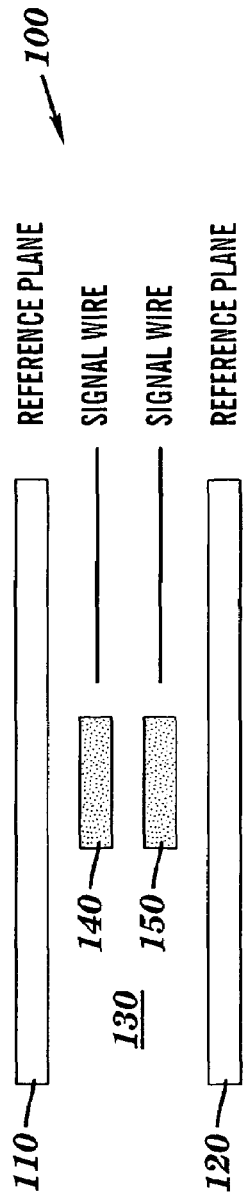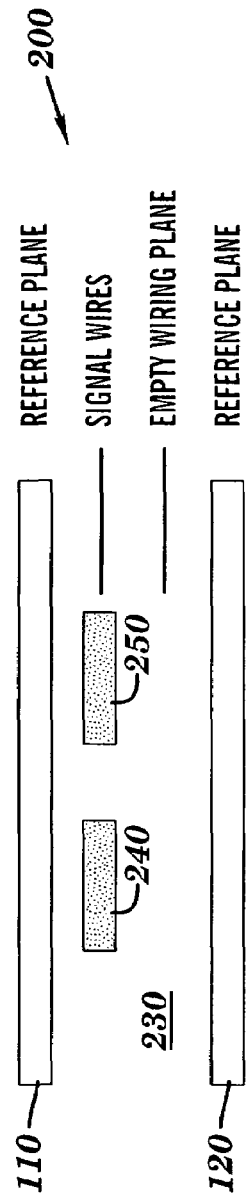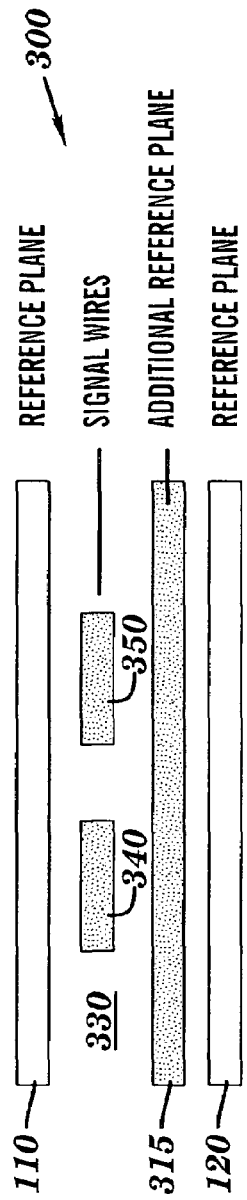

CONCURRENT ELECTRICAL SIGNAL WIRING OPTIMIZATION FOR AN ELECTRONIC PACKAGE

This application is a divisional of Ser. No. 10/041,347; filed on Jan. 8, 2002 now U.S. Pat No. 6,703,706.

BACKGROUND OF THE INVENTION

1. Technical Field

The present invention relates generally to the manufacture of electronic packages, and more particularly to methods and apparatus for optimization of an electronic package. In particular, the present invention relates to optimization of a plurality of wiring solutions for an electronic package. 2. Related Art In a conventional multilayer semiconductor electronic package, such as, inter alia, an Application Specific (ASIC) chip package, or a printed circuit board, a variety of electrical signals are transmitted. Each type of electrical signal is best handled by wires with certain electrical parameters, such as, inter alia, resistance, characteristic impedance, electromagnetic coupling, and whether a single wire or a wire pair is used.

These electrical parameters are usually optimized independently, within each of one or more layers, leading to either more expensive packages with more layers, or leading to the impossible task of accommodating conflicting requirements when the number of layers is limited.

SUMMARY OF THE INVENTION

It is therefore a feature of the present invention to overcome the above shortcomings related to optimizing electrical parameters related to signal wiring, by providing a method of concurrent electrical signal wiring optimization. The disclosed method and apparatus of concurrent electrical signal wiring optimization further provides an electronic package including alternating signals and reference planes. The disclosed method enables concurrent optimization by using a plurality of flexible package wiring solutions. These flexible package wiring solutions are discussed in the Detailed Description, infra. By using various combinations of the flexible package wiring solutions, increased design flexibility results when the method is employed in designing a single semiconductor electronic package. The signal wire structure derived from the disclosed method yields a vertical stacking of signal wires which can achieve low resistance. The disclosed method and resulting apparatus may be applied equally to integrated circuits or printed circuit boards.

In a first general aspect, the present invention provides a method for optimization of a signal wire structure, said method comprising: providing concurrent optimization of a plurality of wire parameters; providing a plurality of wiring solutions, wherein each of said wiring solutions produces a wiring package having different wire parameters; providing an electronic package; determining the optimal wiring solutions for said electronic package; and producing an electronic package, using the optimized wiring package solutions.

In a second general aspect, the present invention provides a substrate comprising: a first conductive plane; a dielectric layer positioned on said first conductive plane; a second conductive plane positioned on said dielectric layer, opposite said first conductive plane; a first conductive circuit member having a first surface positioned in said dielectric layer, said first surface substantially operatively positioned with respect to said first and second conductive planes; a second conductive circuit member having a second surface positioned in said dielectric layer, and spaced from said first conductive member, said second surface substantially operatively positioned with respect to said first and second conductive planes and with said first surface of said first conductive circuit member; and a plurality of conductive contacts electrically connecting said first surface of said first conductive circuit member and said second surface of said second conductive member.

In a third general aspect, the present invention provides a computer system comprising at least one semiconductor chip, wherein said semiconductor chip is connected to a plurality of wiring packages, and said wiring packages include at least one wiring package selected from the group consisting of: a superposed pair of signal wires, a side-by-side pair of signal wires having high characteristic impedance, a side-by-side pair of signal wires having low characteristic impedance, a staggered pair of signal wires, a single signal wire having a low resistance and a medium amount of electromagnetic coupling to other wires, a pair of low resistance signal wires, a single signal wire having a low resistance and a low amount of electromagnetic coupling to other wires, and a single signal wire having a high resistance.

The foregoing and other features and advantages of the invention will be apparent from the following more particular description of embodiments of the invention.

BRIEF DESCRIPTION OF THE DRAWINGS

The features and inventive aspects of the present invention will become more apparent upon reading the following detailed description, claims, and drawings, of which the following is a brief description.

FIG. 1 is a cross sectional representation of a superposed wire pair embodiment of the present invention.

FIG. 2 is a cross sectional representation of a first side-by-side wire pair embodiment of the present invention.

FIG. 3 is a cross sectional representation of a second side-by-side wire pair embodiment of the present invention.

DETAILED DESCRIPTION OF THE EMBODIMENTS

Figure 4:
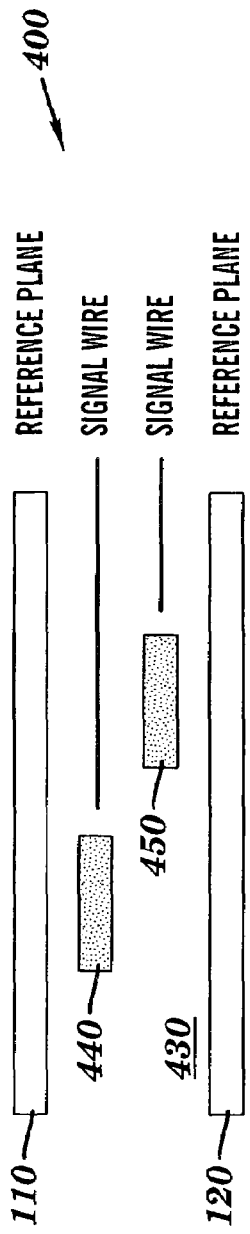
FIG. 4 is a cross sectional representation of a staggered wire pair embodiment of the present invention.

The following is a detailed explanation of the method for optimizing signal wiring using the flexible package wiring solutions, and an electronic package resulting from manufacturing the electronic package using embodiments of the present invention, with reference to the attached drawings. It should be noted that the same reference numbers are assigned to components having approximately the same functions and structural features in the following explanation and the attached drawings to preclude the necessity for repeated explanation thereof.

According to the present invention, successful optimization of signal wiring on an electronic package or structure, such as inter alia, an integrated circuit package or a printed circuit board, can be accomplished by combining various cross section wiring structures to produce the most efficient wiring package for the electronic structure. For the sake of clarity, an integrated circuit package will be addressed in the following description. However, the discussion also applies to printed circuit board fabrication. Eight different wiring package structures are disclosed herein. Any one of them, or any combination of them, may be used to optimize signal wiring in an integrated circuit chip package, such as, inter alia, an ASIC chip package. The present invention has the further advantages of providing fewer layers, since the wiring packages are formed in one substrate. The present invention also provides a method of producing mixed electrical parameters on a single substrate.

Each wiring package is characterized by several characteristics, such as, inter alia, the composition of the wiring package, for example, whether the wiring package is composed of wire pairs or single wires; whether the wire pairs are superposed, staggered, or side-by-side; whether the wiring termination is single-ended or differential; whether the wire characteristic impedance is relatively high or low; whether the wiring density is relatively high or low; whether the coupling within a wire pair is relatively high or low; and whether the coupling to other wires is relatively high or low. These wiring package characteristics are explained infra.

The term "coupling" can be explained as follows. Two wires A and V are said to be "coupled", or be subject to "coupling", when an electrical signal propagating on wire A imparts an electrical signal on wire V. Wire A is often referred to as the "Aggressor" and wire V is referred to as the "Victim".

The phrase "differential coupling" is similarly explained as follows. Three wires A, V1 and V2 are said to be "differentially coupled", or subject to "differential coupling", or present "common mode coupling", when an electrical signal Sa propagating on wire A imparts electrical signals Sv1 and Sv2 on wires V1 and V2, such that the difference between the electrical signals Sv1, Sv2, imparted on V1 and V2, respectively, is much smaller than either of these signals.

Regarding the difference in the terms "differential" vs. "single ended" wiring, there is "single ended wiring" when an electrical signal S transmitted by only one wire W is sufficient to determine its logical or Boolean value. For instance, a low voltage of S may mean a zero, and conversely a high voltage of S would mean a one. There is "differential wiring" when two electrical signals S1 and S2 transmitted by two wires W1 and W2 are necessary to determine the logical or Boolean value transmitted. For instance S1 low and S2 simultaneously high may mean a zero, and vice versa. In this example, if both S1 and S2 were low there would be no value transmitted. Similarly if both S1 and S2 were high there would be no value transmitted.

The wire characteristic impedance, or wire Z0, of a conducting wire, is the square root of its inductance per unit length, divided into its capacitance per unit length. Z0=square root ((L/u)/(C/u)), with L being the inductance and C the capacitance of the wire for a unit length u.

FIG. 1 shows a cross sectional view of a superposed wire pair of a first embodiment of the present invention. The wiring package 100 contains a first reference plane 110 (e.g. a first conductive plane) and a second reference plane 120 (e.g a second conductive plane). Each of the first and second reference planes 110, 120 may be composed of a conductive mesh or a solid conductive material, or a combination of the two. The reference planes 110, 120 are located substantially parallel to each other, and are separated by a space 130, typically a dielectric layer. Within space 130 are located a first signal wire 140 (e.g. a first conductive circuit element) and a second signal wire 150 (e.g. a second conductive circuit element), which are situated in a superposed relationship to each other. Each of first and second signal wires 140, 150 constitute wiring package 100. Wiring package 100 has the following characteristics: differential coupling, high wire resistance (i.e., about 4 ohms), low wire characteristic impedance (i.e., about 35 ohms), high wiring density (i.e., about 200 wires per quadrant), high coupling within the pair, and low coupling to other wires. This information is also summarized in Table 1, infra.

FIG. 2 shows a cross sectional view of a first side-by-side wire pair of a second embodiment of the present invention. The wiring package 200 contains a first reference plane 110 and a second reference plane 120. Each of the first and second reference planes 110, 120 may be composed of a conductive mesh or a solid conductive material, or a combination of the two. The reference planes 110, 120 are located substantially parallel to each other, and are separated by a space 230. Within space 230 are located a first signal wire 240 and a second signal wire 250, which are situated in a side-by-side relationship to each other. Each of first and second signal wires 240, 250 constitute wiring package 200. Wiring package 200 has the following characteristics: either differential or single coupling, high wire resistance (i.e., about 4 ohms), high wire characteristic impedance (i.e., about 50 ohms), low wiring density (i.e., about 100 wires per quadrant), low coupling within the pair, and medium coupling to other wires. This information is also summarized in Table 1, infra.

FIG. 3 shows a cross sectional view of a second side-by-side wire pair of a third embodiment of the present invention. The wiring package 300 contains a first reference plane 110 and a second reference plane 120. Each of the first and second reference planes 110, 120 may be composed of a conductive mesh or a solid conductive material, or a combination of the two. The reference planes 110, 120 are located substantially parallel to each other, and are separated by a space 330. Within space 330 are located a first signal wire 340 and a second signal wire 350, which are situated in a side-by-side relationship to each other, as well as a third reference plane 315. Third reference plane 315 can be located substantially parallel to reference planes 110, 120. Each of first and second signal wires 340, 350 constitute wiring package 300. Wiring package 300 has the following characteristics: differential or single coupling, high wire resistance (i.e., about 4 ohms), low wire characteristic impedance (i.e., about 35 ohms), low wiring density (i.e., about 100 wires per quadrant), low coupling within the pair, and medium coupling to other wires (although this coupling amount is less than that found in the second embodiment shown in FIG. 2). This information is also summarized in Table 1, infra.

FIG. 4 shows a cross sectional view of a staggered wire pair of a fourth embodiment of the present invention. The wiring package 400 contains a first reference plane 110 and a second reference plane 120. Each of the first and second reference planes 110, 120 may be composed of a conductive mesh or a solid conductive material, or a combination of the two. The reference planes 110, 120 are located substantially parallel to each other, and are separated by a space 430. Within space 430 are located a first signal wire 440 and a second signal wire 450, which are situated in a staggered relationship to each other. Each of first and second signal wires 440, 450 constitute wiring package 400. Wiring package 400 has the following characteristics: either differential or single coupling, high wire resistance (i.e., about 4 ohms), high wire characteristic impedance (i.e., about 50 ohms), low wiring density (i.e., about 100 wires per quadrant), low coupling within the pair, and medium coupling to other wires. This information is also summarized in Table 1, infra.

Figure 5:
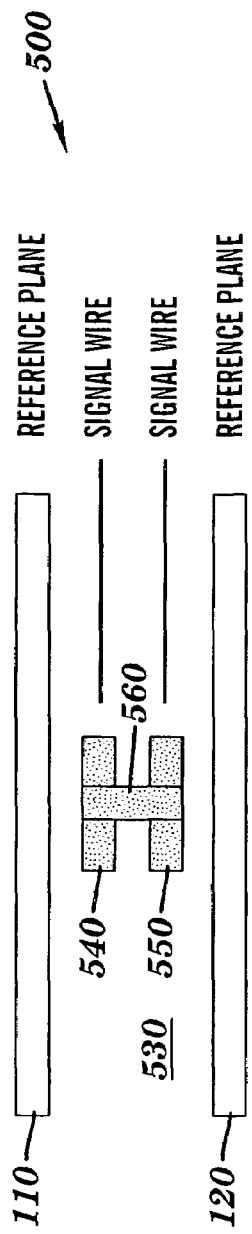
FIG. 5 is a cross sectional representation of a first single wire, low resistance embodiment of the present invention.

FIG. 5 shows a cross sectional view of a first signal wire, low resistance wiring package of a fifth embodiment of the present invention. The wiring package 500 contains a first reference plane 110 and a second reference plane 120. Each of the first and second reference planes 110, 120 may be composed of a conductive mesh or a solid conductive material, or a combination of the two. The reference planes 110, 120 are located substantially parallel to each other, and are separated by a space 530. Within space 530 are located a first signal wire 540 and a second signal wire 550, which are situated in a superposed relationship to each other. First signal wire 540 and second signal wire 550 thus form a superposed structure, and are connected by at least one conductive via 560. Conductive via 560 is substantially perpendicular to both first signal wire 540 and second signal wire 550. The aggregate of first and second signal wires 540, 550 constitute wiring package 500. Wiring package 500 has the following characteristics: single coupling only, low wire resistance (i.e., about 2 ohms), low wire characteristic impedance (i.e., about 35 ohms), low wiring density (i.e., about 100 wires per quadrant), and medium coupling to other wires. This information is also summarized in Table 1, infra.

The first signal wire 540 and second signal wire 550 form a structure in which the wiring layers are superposed, or shadowed, such that one signal wire is over or above the other. Here, first signal 540 is approximately directly above second signal wire 550. This embodiment cuts resistance per unit length substantially in half, while at the same time preserving wiring geometries.

Figure 6:
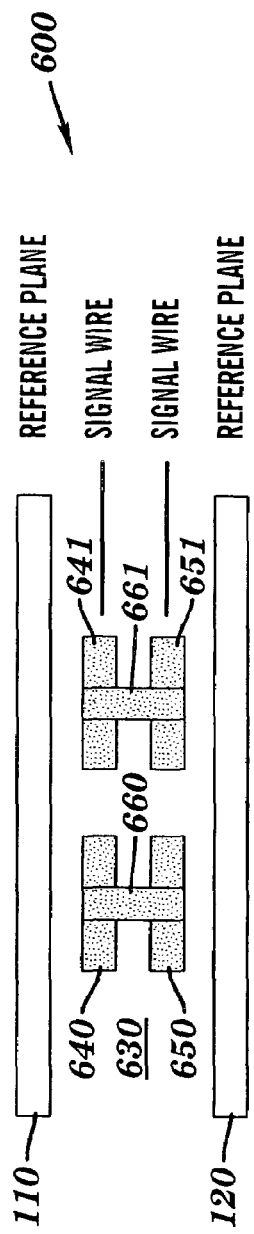
FIG. 6 is a cross sectional representation of a low resistance wire pair embodiment of the present invention.

FIG. 6 shows a cross sectional view of a low resistance wire pair of a sixth embodiment of the present invention, which is a variation on the fifth embodiment shown in FIG. 5. The wiring package 600 contains a first reference plane 110 and a second reference plane 120. Each of the first and second reference planes 110, 120 may be composed of a conductive mesh or a solid conductive material, or a combination of the two. The reference planes 110, 120 are located substantially parallel to each other, and are separated by a space 630. Within space 630 are located first signal wire 640 and second signal wire 650, which are situated in a superposed relationship to each other. First signal wire 640 and second signal wire 650 are connected by first conductive via 660. Also located within space 630 are located third signal wire 641 and fourth signal wire 651, which are situated in a superposed relationship to each other. Third signal wire 641 and fourth signal wire 651 are connected by second conductive via 661. Each of the signal wire pairs 640, 641, and 650, 651 constitute wiring package 600. Wiring package 600 has the following characteristics: either differential or single coupling, low wire resistance (i.e., about 2 ohms), low wire characteristic impedance (i.e., about 35 ohms), low wiring density (i.e., about 100 wires per quadrant), medium coupling within the pair, and medium coupling to other wires (although this coupling amount is less than that found in the second embodiment shown in FIG. 2). This information is also summarized in Table 1, infra.

Figure 7:
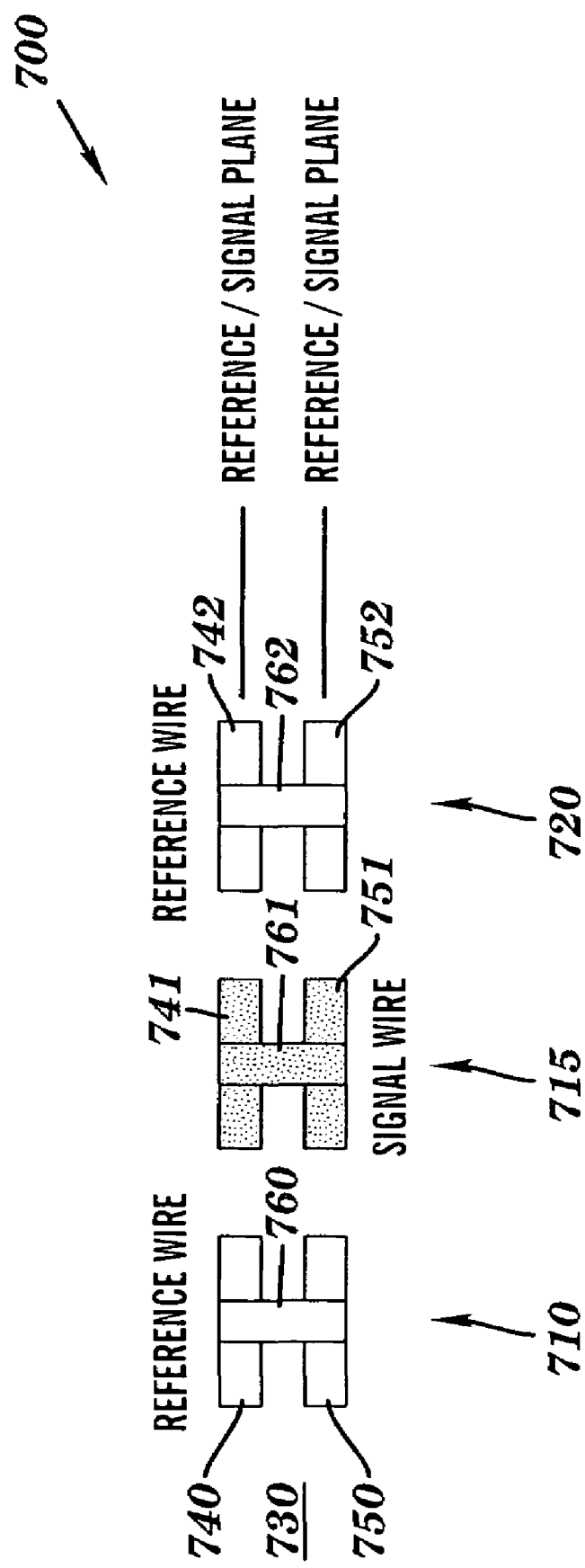
FIG. 7 is a cross sectional representation of a second single wire, low resistance embodiment of the present invention.

FIG. 7 shows a cross sectional view of a second, signal wire, low resistance wiring package of a seventh embodiment of the present invention. Wiring package 700 contains first reference wire pair 710 comprising the superposed combination of first reference wire 740 and second reference wire 750, both of which are connected by first conductive via 760. Wiring package 700 also contains second reference wire pair 720 comprising the superposed combination of third reference wire 742 and fourth reference wire 752, both of which are connected by second conductive via 762. Signal wire pair 715, comprising the superposed combination of first signal wire 741 connected to second signal wire 751 by third conductive via 761, is located within wiring space 730. Signal wire pair 715 is located substantially between first and second reference wire pairs 710, 720. Each of first and second signal wires 741, 751 constitute wiring package 700. Wiring package 700 has the following characteristics: single coupling only, low wire resistance (i.e., about 2 ohms), low wire characteristic impedance (i.e., about 35 ohms), low wiring density (i.e., about 100 wires per quadrant), and low coupling to other wires. This information is also summarized in Table 1, infra.

Figure 8:
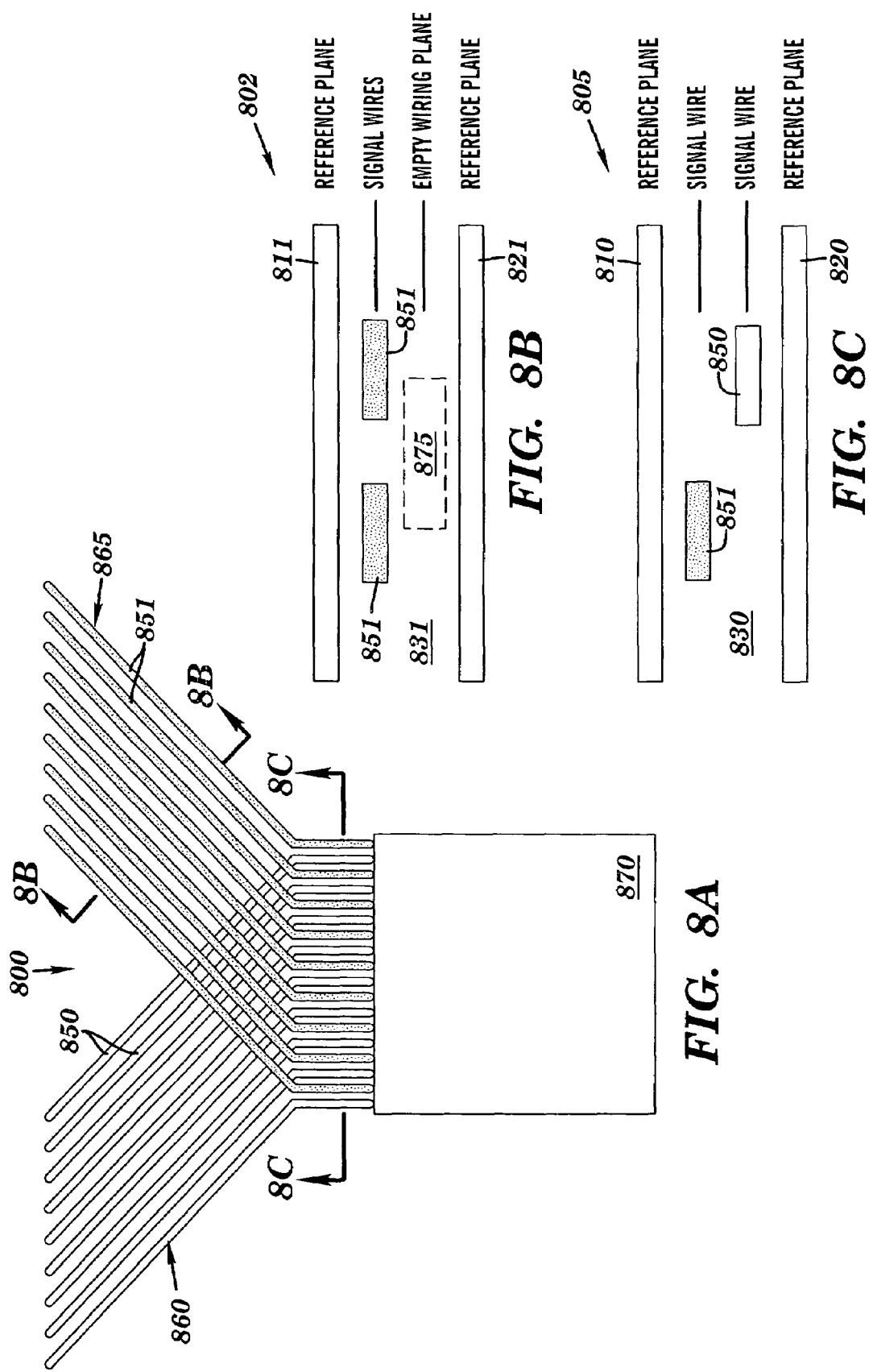
FIG. 8A is a plan view of a signal wire, high resistance embodiment of the present invention.
FIG. 8B is a first cross sectional representation of a portion of the embodiment of FIG. 8A.
FIG. 8C is a second cross sectional representation of a portion of the embodiment of FIG. 8A.

FIG. 8A shows a top view of a signal wire, high resistance wiring package of an eighth embodiment of the present invention. Wiring package 800 contains an integrated circuit 870 to which are connected first wiring package 860 and second wiring package 865. First wiring package 860 comprises signal wires 850 and reference planes (not shown) according to the embodiment shown in FIG. 2 and discussed supra. Second wiring package 865 also comprises signal wires 851 and reference planes 811, 821 (FIG. 8C) according to the embodiment shown in FIG. 2 and discussed supra. Each of first and second signal wires 850, 851 constitute wiring package 800. Wiring package 800 has the following characteristics: single coupling only, high wire resistance (i.e., about 4 ohms), high wire characteristic impedance (i.e., about 50 ohms), high wiring density (i.e., about 200 wires per quadrant), and low coupling to other wires. This information is also summarized in Table 1, infra.

FIG. 8B shows a cross sectional representation (taken at cross section B—B) of a portion of the eighth embodiment of the present invention depicted in FIG. 8A. The wiring package 802 contains a first reference plane 811 and a second reference plane 821. Each of the first and second reference planes 811, 821 may be composed of a conductive mesh or a solid conductive material, or a combination of the two. The reference planes 811, 821 are located substantially parallel to each other, and are separated by a space 831. Within space 831 are located a signal wires 851, and an empty or vacant wiring plane space 875 (shown in phantom).

FIG. 8C shows a cross sectional representation (taken at cross section D—D) of a portion of the eighth embodiment of the present invention depicted in FIG. 8A. The wiring package 805 contains a first reference plane 810 and a second reference plane 820. Each of the first and second reference planes 810, 820 may be composed of a conductive mesh or a solid conductive material, or a combination of the two. The reference planes 810, 820 are located substantially parallel to each other, and are separated by a space 830. Within space 830 are located a first signal wire 851 from wiring package 865 and a second signal wire 850 from wiring package 860.

TABLE 1

Summary of Flexible Package Wiring Solutions for Multiple Wiring or Voltage Domains

| Wiring Type | Figure | Differential or Single Ended | Wire Resistance | Wire Z0 | Wiring Density* | Coupling Within Pair | Coupling to Other Wires |
|---|---|---|---|---|---|---|---|
| Superposed pair | 1 | Differential | High | Low | High | High | Low |
| Side-by-side pair, #1 | 2 | Differential or single | High | High | Low | Low | Medium |
| Side-by-side pair, #2 | 3 | Differential or single | High | Low | Low | Low | Medium, but < "FIG. 2" |
| Staggered pair | 4 | Differential or single | High | High | Low | Low | Medium |
| Signal wire, low R, #1 | 5 | Single only | Low | Low | Low | N/A | Medium |
| Low R pair | 6 | Differential or single | Low | Low | Low | Medium | Medium, but < "FIG. 2" |
| Signal wire, low R, #1 | 7 | Single only | Low | Low | Low | N/A | Low |
| Signal wire, high R | 8A, 8B, 8C | Single only | High | High | High | N/A | Low |

*Normalized to superposed pair (FIG. 1)

A typical ASIC chip can be divided into, for example, four quadrants for wiring design purposes. In each of these four quadrants, a different cross section wiring package can be used. In this way, the wiring can be optimized for the integrated circuit structure.

Figure 9:
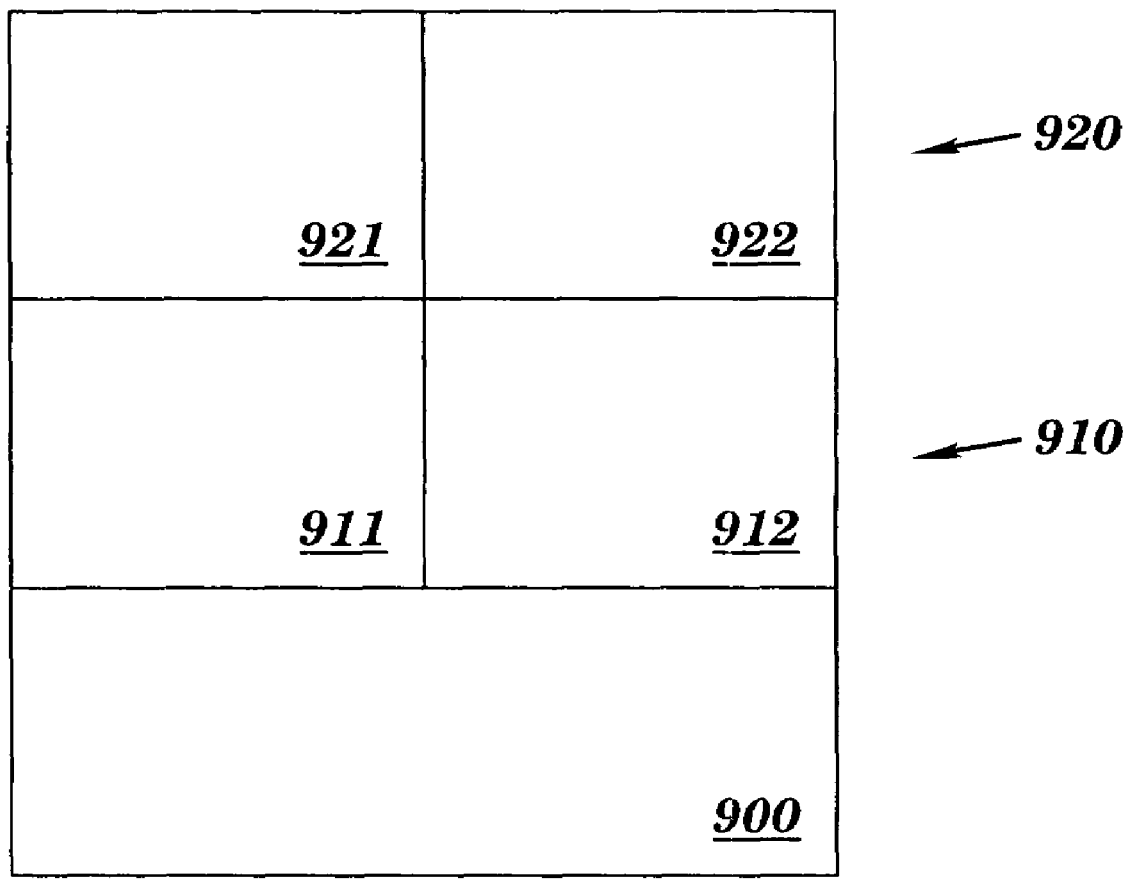
FIG. 9 is a cross-sectional view of a semiconductor device showing various wiring quadrants in one embodiment of the present invention.

Referring now to FIG. 9, an illustrative example of one embodiment of the present invention is shown. Integrated circuit 900 is a typical integrated circuit as is known in the art. A first wiring layer 910 is formed on the integrated circuit using techniques known in the art. A second wiring layer 920 is similarly formed on first wiring layer 910. Each of the first wiring layer 910 and the second wiring layer 920 are subdivided into two wiring zones, thus forming four wiring quadrants 911, 912, 921, 922. According to the present invention, each of wiring quadrants 911, 912, 921, 922 contains a wiring package selected from the eight wiring packages described supra, namely wiring packages 100, 200, 300, 400, 500, 600, 700, and 800. The choice of which wiring package to use in a particular wiring quadrant 911, 912, 921, 922 is dependent upon which of the particular wiring package's characteristics are most appropriate for each wiring quadrant.

Embodiments of the present invention have been disclosed. A person of ordinary skill in the art would realize, however, that certain modifications would come within the teachings of this invention. Therefore, the following claims should be studied to determine the true scope and content of the invention.

What is claimed is:

1. A method comprising:
   determining a first optimal wiring structure for an electronic structure, said first optimal wiring structure comprising a first conductive plane, a second conductive plane, and a first pair of signal wires located between said first conductive plane and said second conductive plane, said first optimal wiring structure having a first plurality of optimal wire characteristics for said electronic structure, wherein the first pair of signal wires is selected from the group consisting of a superposed pair of signal wires, a side-by-side pair of signal wires having high characteristic impedance, a side-by-side pair of signal wires having low characteristic impedance, a staggered pair of signal wires, and a pair of low resistance signal wires; and
   creating said electronic structure comprising said first optimal wiring structure.

2. The method of claim 1, wherein each of said optimal wire characteristics is selected from the group consisting of: wire resistance, wire impedance, electromagnetic coupling, and wire layout.

3. The method of claim 1, further comprising: determining a second optimal wiring structure for said electronic structure, said first optimal wiring structure comprising a third conductive plane, a fourth conductive plane, and a second pair of signal wires located between said third conductive plane and said fourth conductive plane, said second optimal wiring structure having a second plurality or optimal wire characteristics for said electronic structure;
   subdividing said electronic structure into a first wiring zone and a second wiring zone;
   creating said electronic structure comprising said first optimal wiring structure in said first wiring zone and said second optimal wiring structure in said second wiring zone, wherein said first pair of signal wires and said second pair of signal wires are each selected from the group consisting of a superposed pair of signal wires, a side-by-side pair of signal wires having high characteristic impedance, a side-by-side pair of signal wires having low characteristic impedance, and a staggered pair of signal wires, and a pair of low resistance signal wires.

4. The method of claim 1, wherein the electronic structure is an integrated circuit.

5. The method of claim 1, wherein the electronic structure is a printed circuit board.

6. The method of claim 4, wherein said integrated circuit comprises an application specific integrated circuit.

7. The method of claim 1, wherein said first optimal wiring structure further comprises a dielectric layer positioned between said first conductive plane and said second conductive plane and a plurality of conductive vias within said dielectric layer connecting a first signal wire from said first pair of signal wires to a second signal wire from said first pair of signal wires.

8. The method of claim 7, wherein said first pair of signal wires is selected from the group consisting of a superposed pair of signal wires, a side-by-side pair of signal wires having high characteristic impedance, a side-by-side pair of signal wires having low characteristic impedance, a staggered pair of signal wires, and a pair of low resistance signal wires.

9. The method of claim 7, wherein the plurality of conductive vias are substantially perpendicular to both the first signal wire and the second signal wire.

* * * * *

UNITED STATES PATENT AND TRADEMARK OFFICE
CERTIFICATE OF CORRECTION

PATENT NO. : 7,017,128 B2 Page 1 of 1
APPLICATION NO. : 10/738799
DATED : March 21, 2006
INVENTOR(S) : Audet et al.

It is certified that error appears in the above-identified patent and that said Letters Patent is hereby corrected as shown below:

Column 1
Line 16, delete "2."
Line 17, add -- 2. --

Column 8
Line 51, delete "or" and insert -- of --

Signed and Sealed this

Twenty-fifth Day of July, 2006

JON W. DUDAS
*Director of the United States Patent and Trademark Office*